US012633887B2

(12) United States Patent
Straeussnigg et al.

(10) Patent No.: US 12,633,887 B2
(45) Date of Patent: May 19, 2026

(54) FILTERING ARCHITECTURE WITH TRANSIENTS MINIMIZATION DUE TO TEMPORARY SCALING

(71) Applicant: Infineon Technologies AG, Neubiberg (DE)

(72) Inventors: Dietmar Straeussnigg, Villach (AT); Florian Brame, Villach (AT); David Andrew Russell, Bernareggio (IT)

(73) Assignee: Infineon Technologies AG, Neubiberg (DE)

( * ) Notice: Subject to any disclaimer, the term of this patent is extended or adjusted under 35 U.S.C. 154(b) by 149 days.

(21) Appl. No.: 18/422,395

(22) Filed: Jan. 25, 2024

(65) Prior Publication Data

US 2025/0247065 A1    Jul. 31, 2025

(51) Int. Cl.
 *H03G 3/30* (2006.01)
 *H04R 3/04* (2006.01)
(52) U.S. Cl.
 CPC ......... *H03G 3/3026* (2013.01); *H03G 3/3089* (2013.01); *H04R 3/04* (2013.01)

(58) Field of Classification Search
 CPC .. H03G 3/32; H03G 3/24; H03G 3/20; H03G 3/04; H03G 3/3089; H03G 3/3026; H04R 3/00; H04R 19/04; H04R 2430/01
 See application file for complete search history.

(56) References Cited

U.S. PATENT DOCUMENTS

| | | | | |
|---|---|---|---|---|
| 9,282,406 | B2 * | 3/2016 | Bogason | H04R 1/005 |
| 9,979,367 | B2 * | 5/2018 | Rombach | H03G 3/3005 |
| 10,341,770 | B2 * | 7/2019 | Baumgarte | H03G 5/165 |
| 10,461,714 | B2 * | 10/2019 | Lesso | H03G 3/3089 |
| 10,797,715 | B2 | 10/2020 | Straeussnigg et al. | |
| 11,121,690 | B2 * | 9/2021 | Lesso | H03F 1/34 |
| 12,325,627 | B2 * | 6/2025 | Straeussnigg | B81B 7/008 |
| 12,368,421 | B2 * | 7/2025 | Ceballos | H03F 1/0277 |
| 2023/0344398 | A1 | 10/2023 | Ceballos et al. | |
| 2025/0094211 | A1 * | 3/2025 | Spittle | H04R 5/04 |

* cited by examiner

*Primary Examiner* — Disler Paul
(74) *Attorney, Agent, or Firm* — Slater Matsil, LLP

(57) ABSTRACT

A digital filter includes a delay line; coefficients coupled to the delay line; and a summer coupled to at least one of the of coefficients, wherein the coefficients each include a first value during a normal mode of operation, and wherein at least one of the coefficients comprises a second value during a transient mode of operation.

21 Claims, 12 Drawing Sheets

Gain change: g

Gain change : g

350

| | normal operation |
| --- | --- |
| $b_0$ $b_1$ $b_2$ $(-a_1$ $)$ $(-a_2$ $)$ | |

| | temporary scaling |
| --- | --- |
| $b_0$ $g^*b_1$ $g^*b_2$ $g^*(-a_1$ $)$ $g^*(-a_2$ $)$ | |
| $b_0$ $b_1$ $g^*b_2$ $(-a_1$ $)$ $g^*(-a_2)$ | |

| | normal operation |
| --- | --- |
| $b_0$ $b_1$ $b_2$ $(-a_1$ $)$ $(-a_2$ $)$ | | normal operation temporary scaling normal operation $(-a_2)$ $g*(-a_2)$
$g*(-a_2)$ $(-a_2)$ $(-a_1)$ $(-a_1)$
$g*(-a_1)$ $(-a_1)$ $b_2$ $g*b_2$
$g*b_2$ $b_2$ $b_1$ $b_1$
$g*b_1$ $b_1$

Gain change : $g$ $b_0$ $b_0$
$b_0$ $b_0$

SETTING A COEFFICIENT OF A FILTER OF A DIGITAL MICROPHONE TO A FIRST VALUE DURING A NORMAL MODE OF OPERATION OF THE DIGITAL MICROPHONE
702

SETTING THE COEFFICIENT OF THE FILTER OF THE DIGITAL MICROPHONE TO A SECOND VALUE DURING A TRANSIENT MODE OF OPERATION OF THE DIGITAL MICROPHONE
704

700

FILTERING ARCHITECTURE WITH TRANSIENTS MINIMIZATION DUE TO TEMPORARY SCALING

RELATED CASE INFORMATION

The present application is related to co-pending U.S. patent application Ser. No. 18/494,567 filed on Oct. 25, 2023 and entitled "FILTERING ARCHITECTURE WITH MINIMIZED TRANSIENTS," which is hereby incorporated by reference, and is related to co-pending US Patent Application filed on the filing date of the present application (Jan. 25, 2024) and entitled "TRANSIENTS MINIMIZATION OF DIGITAL SYSTEMS DUE TO MEMORY UPDATE," which is also hereby incorporated by reference.

TECHNICAL FIELD

The present invention relates generally to a filtering architecture with transients minimization due to temporary scaling, and, in particular embodiments, to a filter, digital microphone, and method therefor.

BACKGROUND

Digital microphones are known in the art. Customer requests for digital microphone features like dynamic acoustic overload point (AOP) switching or requirements for increased signal-to-noise ratio (SNR) and reduced power consumption from customer are also increasing. These specifications have led to the introduction of architectures shown in FIG. 1, which is described in further detail below. In the analog domain, the signal is lowered by a gain change in a programmable gain amplifier (PGA) to achieve a higher dynamic range, if a high level acoustic signal occurs. This gain change is compensated in the digital domain in order to achieve a linear signal without undesirable audible transient signals.

FIG. 1 is a block diagram of digital microphone 100 including a gain switching feature initiated by a "ctr" control signal 118. Digital microphone 100 includes a capacitive microelectromechanical system (MEMS) device 102 for providing an analog signal in response to ambient sound waves. MEMS devices 102 is coupled to an application-specific integrated circuit (ASIC) 104 including a PGA 106 for receiving the "ctr" control signal 118, an analog-to-digital converter (ADC) 108 coupled to PGA 106, and a digital low pass filter 110 coupled to ADC 108. ASIC 104 also includes a digital compensation block 112 coupled to the digital low pass filter 110 and for also receiving the "ctr" control signal 118, and a digital modulator 114 coupled to the digital compensation block 112 coupled to the digital low pass filter 110. The digital modulator 114 is configured for providing a one-bit digital output signal at digital output bus 120.

In some implementations of digital microphone 100, ADC 108 can comprise a sigma-delta ADC. The output signal of the sigma delta ADC (sigma-delta converter) is reconstructed in the digital domain (e.g. by low-pass filtering with minimized transients) as is depicted in FIG. 1. This "step" (due to gain change) generates a transient in the digital filter chain, which reduces the performance (e.g. audible artefacts). A technique for minimizing the audible transients is described in further detail in co-pending U.S. patent application Ser. No. 18/494,567, which was incorporated by reference above. Further such techniques are needed for keeping up with increasing customer requirements.

SUMMARY

According to an embodiment, a filter comprises a delay line; a plurality of coefficients coupled to the delay line; and a summer coupled to at least one of the plurality of coefficients, wherein the plurality of coefficients each comprise a first value during a normal mode of operation, and wherein at least one of the plurality of coefficients comprises a second value during a transient mode of operation.

According to an embodiment, a digital microphone comprising a programmable gain amplifier (PGA); an analog-to-digital converter (ADC) coupled to the PGA; a digital filter coupled to the ADC, wherein the digital filter comprises a plurality of coefficients; and a digital gain compensation component coupled to the digital filter, wherein the plurality of coefficients each comprise a first value during a normal mode of operation of the digital microphone, and wherein at least one of the plurality of coefficients comprises a second value during a transient mode of operation of the digital microphone.

According to an embodiment, a method of operating a digital microphone comprises setting a coefficient of a filter of the digital microphone to a first value during a normal mode of operation of the digital microphone; and setting the coefficient of the filter of the digital microphone to a second value during a transient mode of operation of the digital microphone.

BRIEF DESCRIPTION OF THE DRAWINGS

For a more complete understanding of the present invention, and the advantages thereof, reference is now made to the following descriptions taken in conjunction with the accompanying drawings, in which:

FIG. 4B is a table of filter coefficients associated with the digital IIR filter of FIG. 4A during a normal operational mode and during a temporary scaling mode;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

According to embodiments, signal memory of a digital filter is used to store scaled digital filter coefficient values. These scaled digital filter coefficient values are used during a temporary transient reduction mode of operation accordingly to minimize or even completely avoid audible transients created in the digital signal processing chain of the digital microphone. As noted above, the audible transients appear during gain switching of the digital microphone. According to embodiments, the signal memory is stored in the delay lines of the digital filter of a digital microphone (especially a digital FIR filter, described in detail below). After a gain change "g," all of the contents of the delay line of the filter are scaled by the gain change "g" as well. Instead of compensating the gain change "g" in the delay line, the compensation is done by using scaled filter coefficients (scaled by the gain change "g") during a gain switching transition. The temporary scaling of digital filter coefficients in order to minimize audible transients is explained in further detail below with regards to a filter, a digital microphone, and a method of operating a digital microphone.

Figure 1:
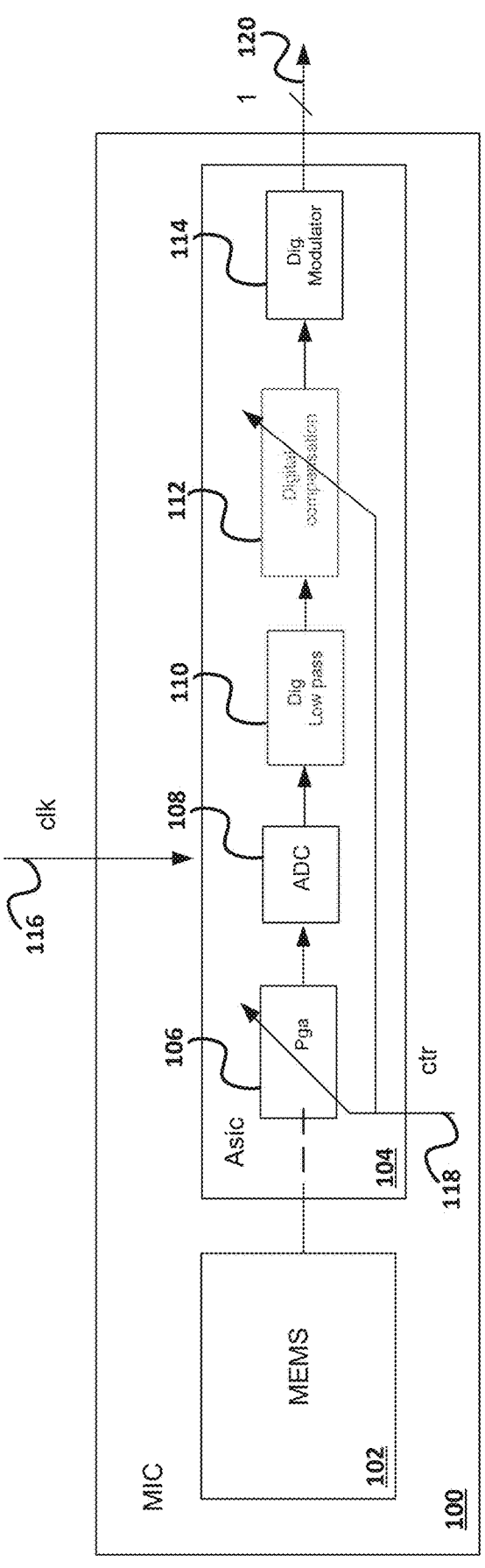
FIG. 1 is a block diagram of digital microphone including gain switching.
Figure 2A:
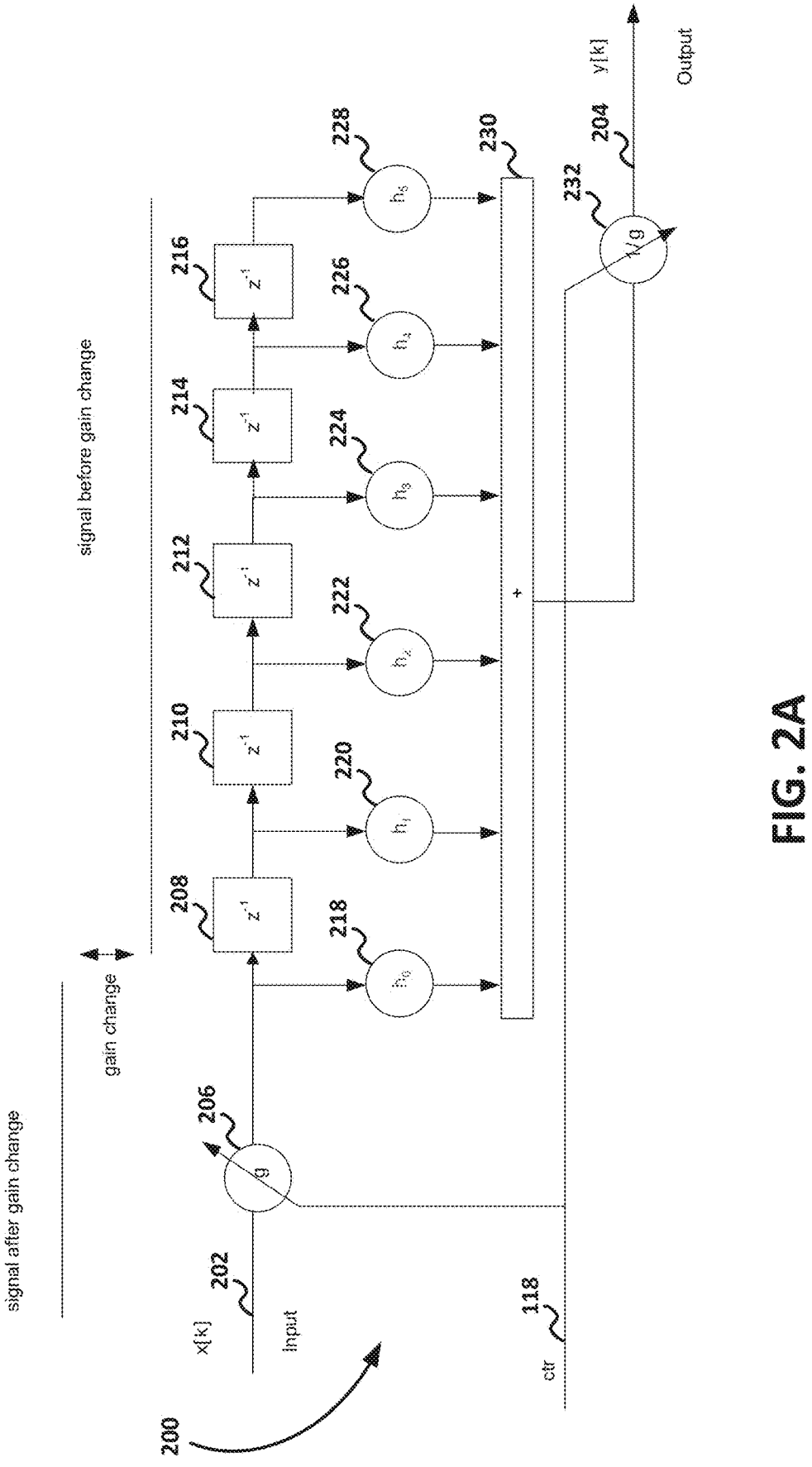
FIG. 2A is a schematic diagram of a digital finite impulse response (FIR) filter with transient reduction due temporary scaling of filter coefficients, according to an embodiment.

FIG. 2A is a schematic diagram of a digital finite impulse response (FIR) filter 200 with transient reduction due temporary scaling of filter coefficients, according to an embodiment. (Digital FIR filter 200 can correspond to the digital low pass filter 110 shown in FIG. 1, in an embodiment.) Digital FIR filter 200 comprises a delay line including one or more delay units 208, 210, 212, 214, and 216. While a fifth-order filter is shown in FIG. 2A, any number of delay units can be used to realize a different order filter. Each delay unit 208, 210, 212, 214, and 216 is shown in the inverse Z-transform notation that is can be implemented in the digital domain, other types of delay units can also be used. The delay line including one or more delay units 208, 210, 212, 214, and 216 is coupled to one or more filter coefficients $h_0$ 218, $h_1$ 220, $h_2$ 222, $h_3$ 224, $h_4$ 226, and $h_5$ 228. Each of the filter coefficients can be realized as a memory component such as a volatile or non-volatile memory or a lookup table (LUT). The one or more filter coefficients $h_0$ 218, $h_1$ 220, $h_2$ 222, $h_3$ 224, $h_4$ 226, and $h_5$ 228 are coupled to a summer 230. A gain component 206 with a gain of "g" is coupled between an input 202 of filter 200 and an input of delay unit 208 and filter coefficient $h_0$ 218. An inverse gain component 232 with a gain of "1/g" is coupled between an output of summer 230, and an output 204 of filter 200. Both gain component 206 and inverse gain component 232 are switched under the control of the "ctr" control signal 118. The control signal 118 is used to switch digital filter between a first constant digital microphone gain and a second constant digital microphone gain in the example of FIG. 2A.

To minimize audible transients of digital microphone 200, the signal history, which is stored in the memory of the filter, is used. According to embodiments "temporary scaling" of filter coefficients is described in further detail below based on the operation of digital FIR filter 200, which is represented in FIG. 2A.

For simplicity reasons it is assumed that a constant signal is applied at the input 202 of digital filter 200 and a step gain change "g" of the input signal, controlled by the control signal 118 "ctr", happens. At the switching event, in the delay line of the digital FIR filter 200, the signal history is stored and at the input 202 of the filter the jump of the signal is visible. This discontinuity generates an undesired audible transient signal. To avoid this jump temporary scaling of the filter coefficients is applied, in an embodiment. One option is to overwrite all memory registers with the current values scaled by the gain change "g". Another option, according to an embodiment, is to incorporate the scaling into the coefficients $h_1$ of the digital filter 200. In FIG. 2A this approach is descripted in detail. When the gain change occurs (controlled by ctr) all coefficients $h_1$ (except for filter coefficient $h_0$) are scaled by a factor of "g". Cycle by cycle, the registers are filled with the gain changed values and accordingly fewer coefficients are scaled by the gain factor "g" (see the table in FIG. 2B, which is described in further detail below). The output y[k] 204 of the digital filter 200 is scaled by the inverse gain factor "1/g". Generally the length of the temporary scaling is determined by the order of the FIR filter. For example, a fifth order filter corresponds to a transient mode of operation wherein the temporary scaling of coefficients is applied requiring five clock cycles.

Figure 2B:
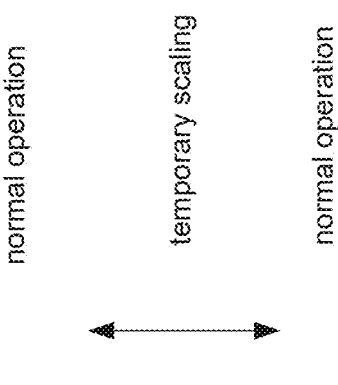
FIG. 2B is a table of filter coefficients associated with the digital FIR filter of FIG. 2A during a normal operational mode and during a temporary scaling mode.
Figure 2B:

FIG. 2B is a table 250 of filter coefficients associated with the digital FIR filter of FIG. 2A during a normal operational mode and during a temporary scaling mode (transient mode). In the example of FIG. 2B a first constant input value and a step change to a second constant input value with a gain of "g" is assumed. The gain change of digital microphone 200 causes audible transients until the delay line is filled with the gain change signal. According to embodiments, due to the fact that the signal history is stored in the delay line of the filter 200 a temporary scaling of the filter coefficients is used to avoid these audible transients.

Table 250 shows the $h_0$, $h_1$, $h_2$, $h_3$, $h_4$, and $h_5$ filter coefficients of digital filter 200 in a normal operation mode having a first gain value, in a transient or temporary scaling mode of operation (taking five clock cycles to complete), and in a normal operation mode having a second gain value. In the normal operation mode, all of the filter coefficients have nominal values. During a first clock cycle of the transient mode of operation (after receiving the "ctr" gain change control signal) all of the filter coefficients (except for filter coefficient $h_0$) are updated to have the nominal value multiplied by the gain value "g". During a second clock cycle of the transient mode of operation all of the filter coefficients (except for filter coefficients $h_0$ and $h_1$) are updated have the nominal value multiplied by the gain value "g". During a third clock cycle of the transient mode of operation filter coefficients $h_0$, $h_1$, and $h_2$ have the nominal values, and filter coefficients $h_3$, $h_4$, and $h_5$ are updated to have the nominal value multiplied by the gain value "g". During a fourth clock cycle of the transient mode of operation filter coefficients $h_0$, $h_1$, $h_2$, and $h_3$ have the nominal values, and filter coefficients $h_4$ and $h_5$ are updated to have the nominal value multiplied by the gain value "g". During a fifth clock cycle of the transient mode of operation all filter coefficients assume the nominal values except for filter coefficient $h_5$, which is updated to have the nominal value multiplied by the gain value "g". The table 250 shows that after the transient mode of operation, another normal mode of operation is resumed with all of the nominal filter coefficient values, but with a new constant gain value for the digital microphone.

Figure 3A:
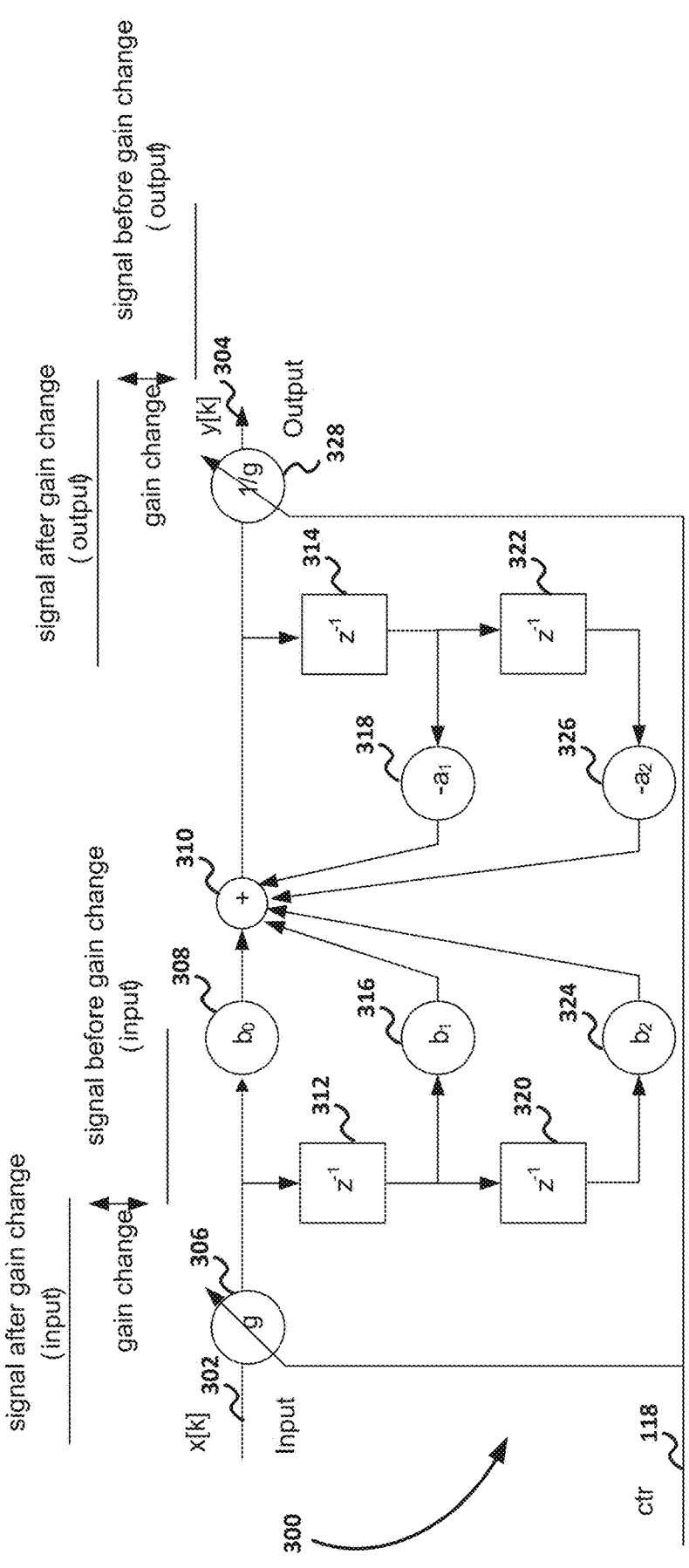
FIG. 3A is a schematic diagram of a digital infinite impulse response (IIR) filter (direct form, 2nd order) with transient reduction due to temporary scaling of filter coefficients, according to an embodiment.

FIG. 3A is a schematic diagram of a digital infinite impulse response (IIR) filter 300 (direct form, second order) with transient reduction due to temporary scaling of filter coefficients, according to an embodiment. Digital IIR filter 300 includes a delay line including delay units 312, 314, 320, and 322 (shown in inverse Z-transform notation symbols). The delay line is coupled to a summer 310 through filter coefficients $b_0$ 308, $b_1$ 316, $b_2$ 324, $-a_1$ 318, and $-a_2$ 326. A gain component 306 having a gain value of "g" is coupled between the input 302 of filter 300 and an input of filter coefficient 308 and an input of delay unit 312. An inverse gain component 328 having a gain value of "1/g" is coupled between the output 304 of filter 300 and an output of summer 310 and an input of delay unit 314. Both gain component 306 and inverse gain component 328 are under control of the "ctr" control signal 118, which is used to change the overall gain of the digital microphone.

According to embodiments, temporary scaling of filter coefficients can be extended to IIR filters such as filter 300 shown in FIG. 3A. In FIG. 3A temporary scaling of filter coefficients is applied to a second order IIR filter 300 with direct form implementation, however any order filter can be used in other embodiments. As was described for the FIR filter 200 shown in FIG. 2A, one option, according to an embodiment, is to overwrite all registers with the current values scaled by the gain change "g". Another option, according to another embodiment, is to incorporate the gain scaling into the coefficients "$a_i$" and "$b_i$" of the filter (see table 350 shown in FIG. 3B, which is described in further detail below). Generally, the length of the temporary scaling is determined by the order of the IIR filter, so the temporary scaling finishes much faster compared to a FIR filter. For example, in the table of FIG. 3B is should be noted that only two clock cycles are required for the transient operation mode.

Figure 3B:
FIG. 3B is a table of filter coefficients associated with the digital IIR filter of FIG. 3A during a normal operational mode and during a temporary scaling mode.

FIG. 3B is a table 350 of filter coefficients associated with the digital IIR filter 300 of FIG. 3A during a normal operational mode and during a temporary scaling mode. In the example of FIG. 3A and FIG. 3B a first constant input and then a step gain change is introduced into the digital microphone. The step gain change causes audible transients until the delay line is filled with the gain changed signal. Since the signal history is stored in the delay line of the filter, temporary scaling of the filter coefficients can be applied to avoid or at least greatly reduce audible transients during the gain change.

In table 350, all of the filter coefficients have a nominal value during the initial normal mode of operation. During a first clock cycle of the transient mode of operation (temporary scaling of filter coefficients), all filter coefficients are updated (except for the $b_0$ filter coefficient) to have a value equal to the nominal value multiplied by the gain factor "g". During a second clock cycle of the transient mode of operation (temporary scaling of filter coefficients), the "$a_2$" and "$b_2$" filter coefficients are updated to have a value equal to the nominal value multiplied by the gain factor "g". All of the other filter coefficients retain the nominal value. In the return to the normal operation mode (at the higher digital filter gain value) all of the nominal filter coefficient values are restored.

Figure 4A:
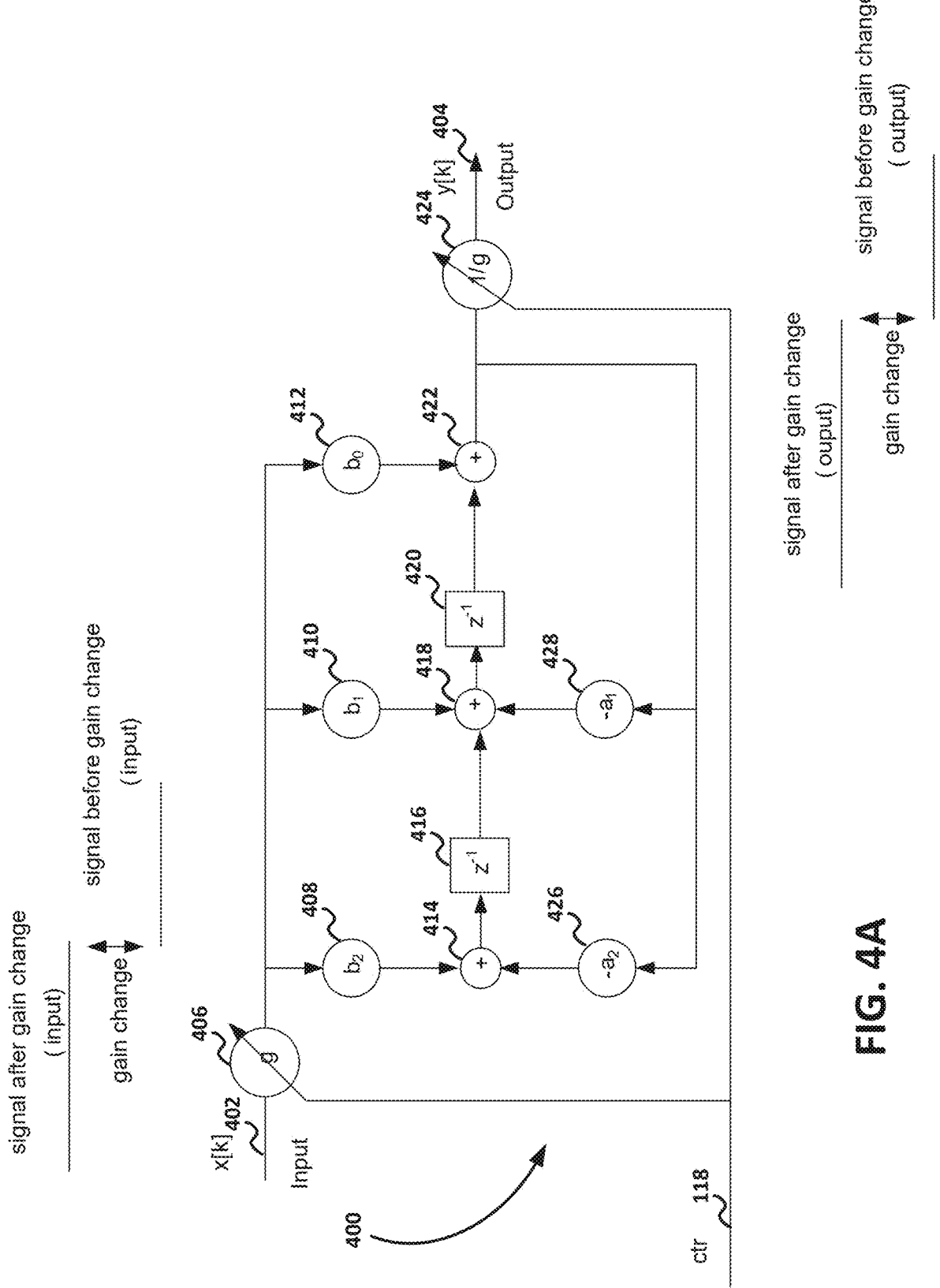
FIG. 4A is a schematic diagram of a digital IIR filter (canonical form, 2nd order) with transient reduction due to temporary scaling of filter coefficients, according to an embodiment.

FIG. 4A is a schematic diagram of a digital IIR filter 400 (canonical form, second order) with transient reduction due to temporary scaling of filter coefficients, according to an embodiment. Digital IIR filter 400 can correspond to the digital low pass filter 110 shown in FIG. 1 in an embodiment. While a second order digital IIR filter is shown in FIG. 4A, any order of filter can be used, as previous described with respect to other filter embodiments. Digital IIR filter 400 includes filter coefficients $b_2$ 408 and $-a_2$ 426 coupled to summer 414, filter coefficients $b_1$ 410 and $-a_1$ coupled to summer 418, and filter coefficient $b_0$ 412 coupled to summer 422. Summer 414 is coupled to summer 418 through delay unit 416, and summer 418 is coupled to summer 422 through delay unit 420. Delay units 416 and 420 comprise a delay line, and are both shown as inverse Z-transform components. Other types of delay units can also be used in some embodiments. Digital IIR filter 400 also includes a gain component 406 with a gain of "g" and an inverse gain component 424 with a gain of "1/g". Both gain component 406 and inverse gain component 424 are under control of the "ctr" control signal 118 for switching between gain modes. In the example of FIG. 4A, a constant gain is assumed before and after a gain changed initiated by the "ctr" control signal at both the input and output of digital IIR filter 400. Gain component 406 is coupled between the input 402 of digital IIR filter 400 and the input of filter coefficients $b_2$ 408, $b_1$ 410, and $b_0$ 412. Inverse gain component 424 is coupled between the output of filter coefficients $-a_2$ 426 and $-a_1$ 428, as well as the output of summer 422, and the output of digital IIR filter 400.

Figure 4B:
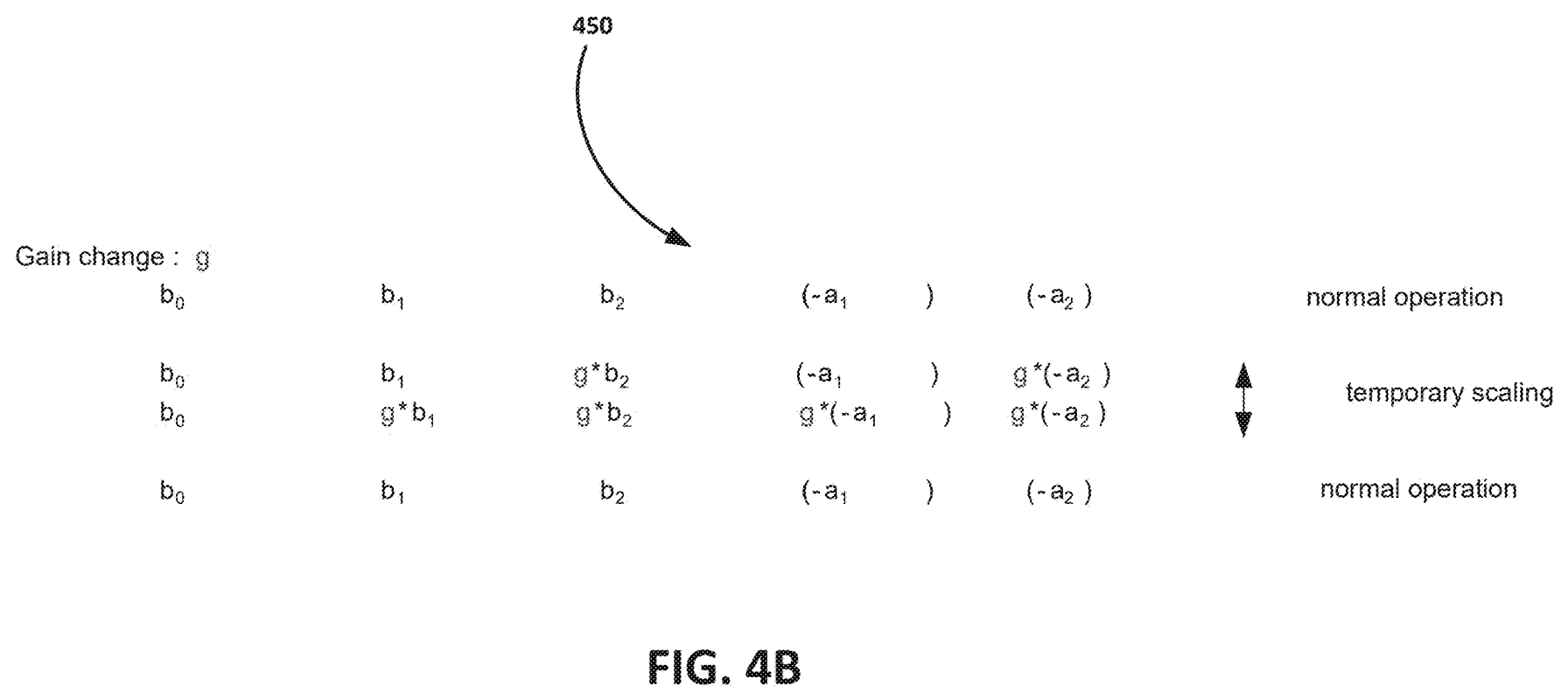

FIG. 4B is a table 450 of filter coefficients associated with the digital IIR filter 400 of FIG. 4A during a normal operational mode and during a temporary scaling mode. In the example of FIG. 4B three modes of operation are shown: an initial normal operation have a first constant gain, a temporary scaling or transient mode of operation having a length of two clock cycles corresponding to a second order filter, and a final normal operation having a second constant gain. Recall that digital IIR filter 400 is a filter in the digital processing of a digital microphone such as digital microphone 100 shown in FIG. 1, having two gain modes controlled by the "ctr" control signal.

In the initial normal mode of operation, all filter coefficients have nominal values. In a first clock cycle of the temporary scaling or transient mode of operation, filter coefficient $b_2$ and filter coefficient $-a_2$ are both multiplied by the gain factor "g". In a second clock cycle of the temporary scaling or transient mode of operation, all filter coefficients (except for filter coefficient $b_0$) are multiplied by the gain factor "g". The multiplication can be implemented by reading out a different value from memory or a lookup table (LUT).

The digital IIR filter 400 described above has a canonical form implementation (i.e., standard form, minimal realization). For this topology two clock cycles for the temporary scaling is needed. In addition, advantageously no additional multipliers are required. It should be noted that the temporary scaling starts two cycles before the gain change occurs. The delay is implemented internally based on a delayed control signal. In other words, the temporary scaling of filter coefficients is delayed internally relative to the switching control signal and the gain switching is thus delayed accordingly.

Figure 5A:
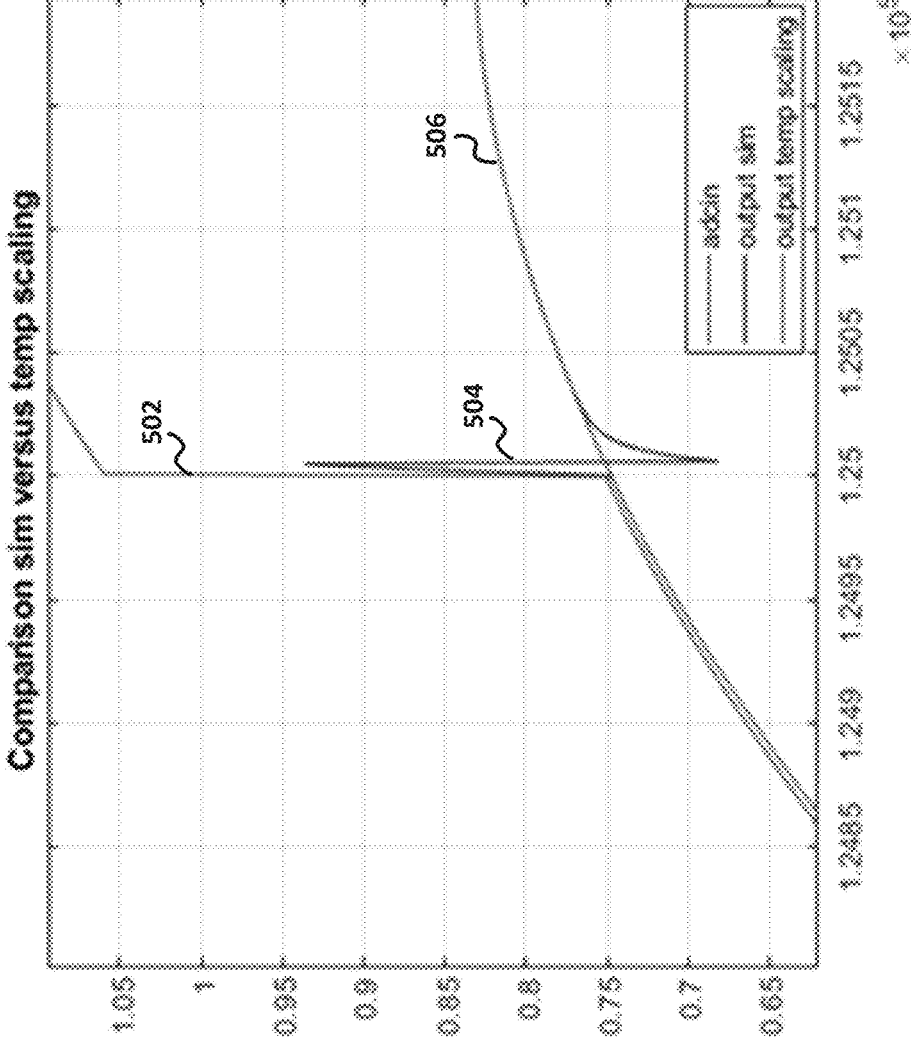
FIG. 5A is a graphical comparison of time domain signals for a digital IIR filter with and without transient reduction due to temporary scaling of filter coefficients, according to an embodiment.

FIG. 5A is a graphical comparison 500 of time domain signals (amplitude versus time) for a digital IIR filter with and without transient reduction due to temporary scaling of filter coefficients, according to an embodiment. In FIG. 5A an ADC input signal 502 of a digital microphone is shown, including a DC step function at the time the gain of the digital microphone is changed via a control signal. A simulated output signal 504 of the digital microphone without temporary coefficient scaling clearly shows an audible artefact at and shortly after the gain change event. A simulated output signal 506 of the digital microphone with the temporary coefficient scaling, according to an embodiment, shows a smooth AC output signal without any audible artefacts caused by the DC step function or by ringing of the digital signal processing chain of the digital microphone.

Figure 5B:
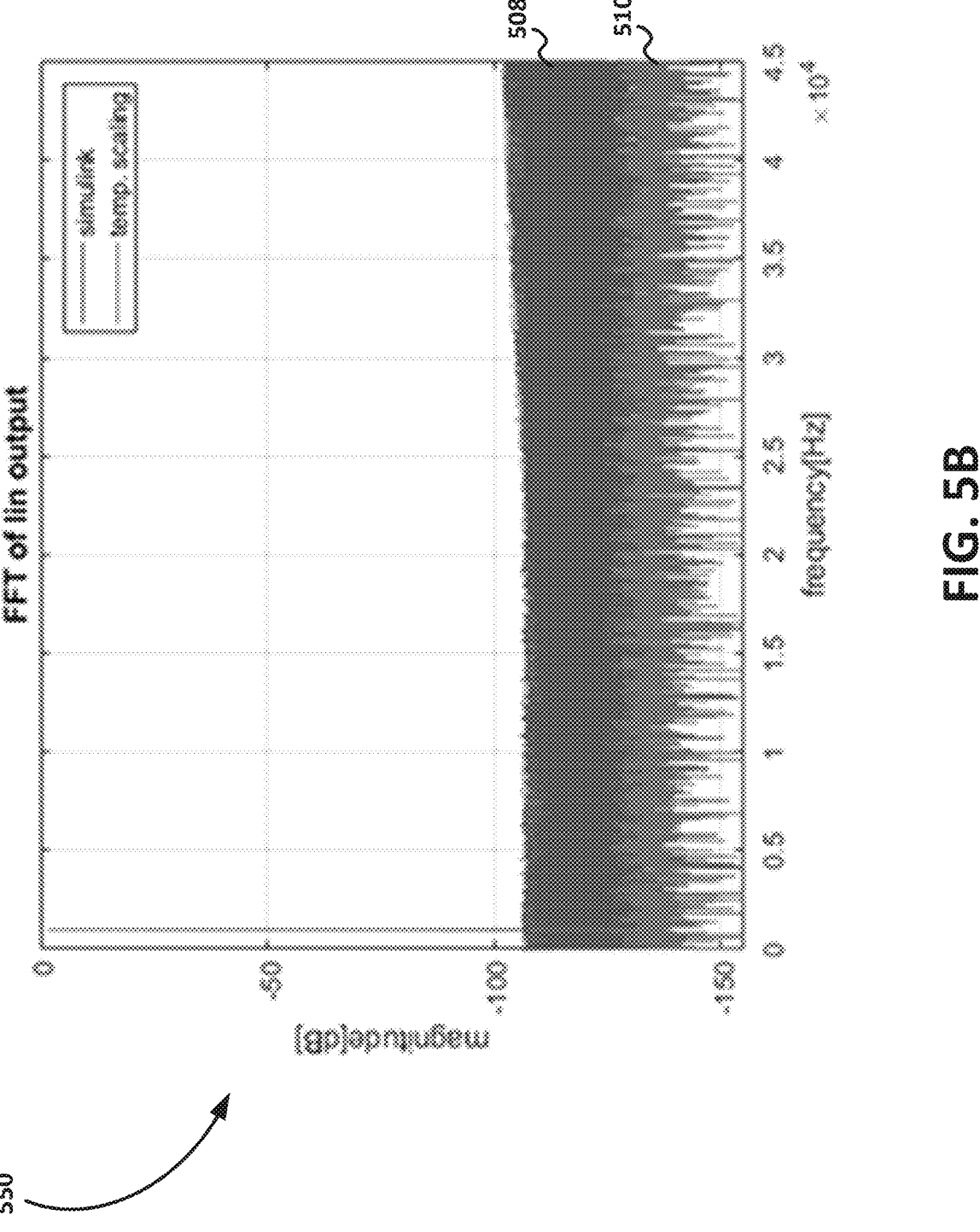
FIG. 5B is a graphical comparison of frequency domain signals for the digital IIR filter of FIG. 5A with and without transient reduction due to temporary scaling of filter coefficients, according to an embodiment.

FIG. 5B is a graphical comparison 550 of frequency domain signals (amplitude versus frequency) for the digital IIR filter of FIG. 5A with and without transient reduction due to temporary scaling of filter coefficients, according to an embodiment. In FIG. 5B the noise level 508 of the digital microphone is shown at a first noise level without the transient reduction due to temporary scaling of filter coefficients, and the noise level 510 of the digital microphone is shown at a second noise level less than the first noise level with the transient reduction due to temporary scaling of filter coefficients, according to an embodiment.

In the simulation used to generate the signals shown in FIG. 5A and FIG. 5B, a first order digital IIR low-pass filter was chosen to show the reduction of the transients based on embodiment methods of temporary scaling of filter coefficients. Simulation parameters included: a gain switching of 3 dB; an input signal of at 1 kHz and −5 decibels with respect to full scale (dBFS); and a configuration wherein the ADC of the simulated digital microphone was bypassed. In conclusion, neither FIG. 5A (time domain) nor FIG. 5B (frequency domain) shows any evidence of audible transients when the temporary scaling of filter coefficients according to embodiments was used.

Figure 6A:
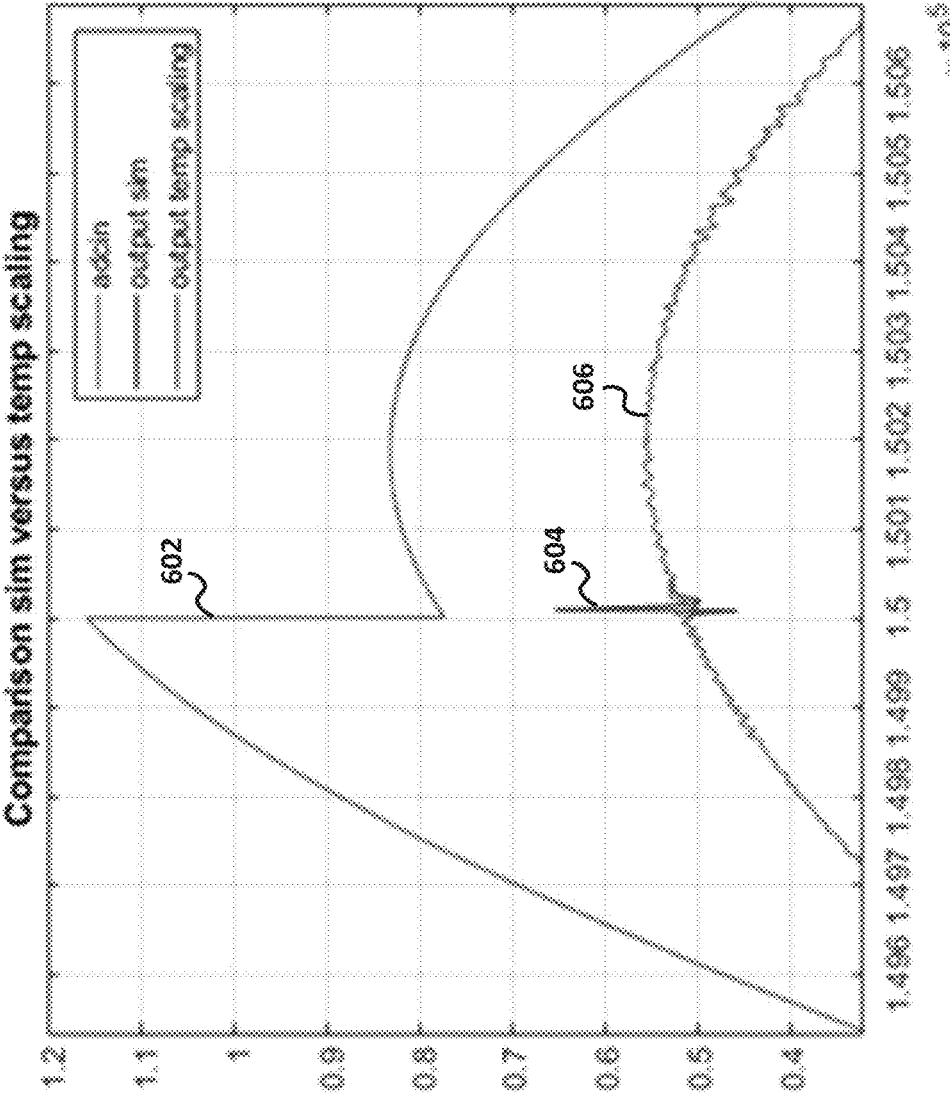
FIG. 6A is a graphical comparison of time domain signals for a digital IIR filter including an ADC with and without transient reduction due to temporary scaling of filter coefficients, according to an embodiment.
Figure 6A:

FIG. 6A is a graphical comparison of time domain signals (amplitude versus time) for a digital IIR filter including an ADC with and without transient reduction due to temporary scaling of filter coefficients, according to an embodiment. In FIG. 6A an ADC input signal 602 of a digital microphone is shown, including a DC step function at the time the gain of the digital microphone is changed via a control signal. A simulated output signal 604 of the digital microphone without temporary coefficient scaling clearly shows an audible artefact at and shortly after the gain change event. A simulated output signal 606 of the digital microphone with the temporary coefficient scaling, according to an embodiment, shows a smooth AC output signal without any audible artefacts caused by the DC step function or by ringing of the digital signal processing chain of the digital microphone. Simulated output signal 606 does show a small noise signal from the noise generated by the simulated ADC.

Figure 6B:
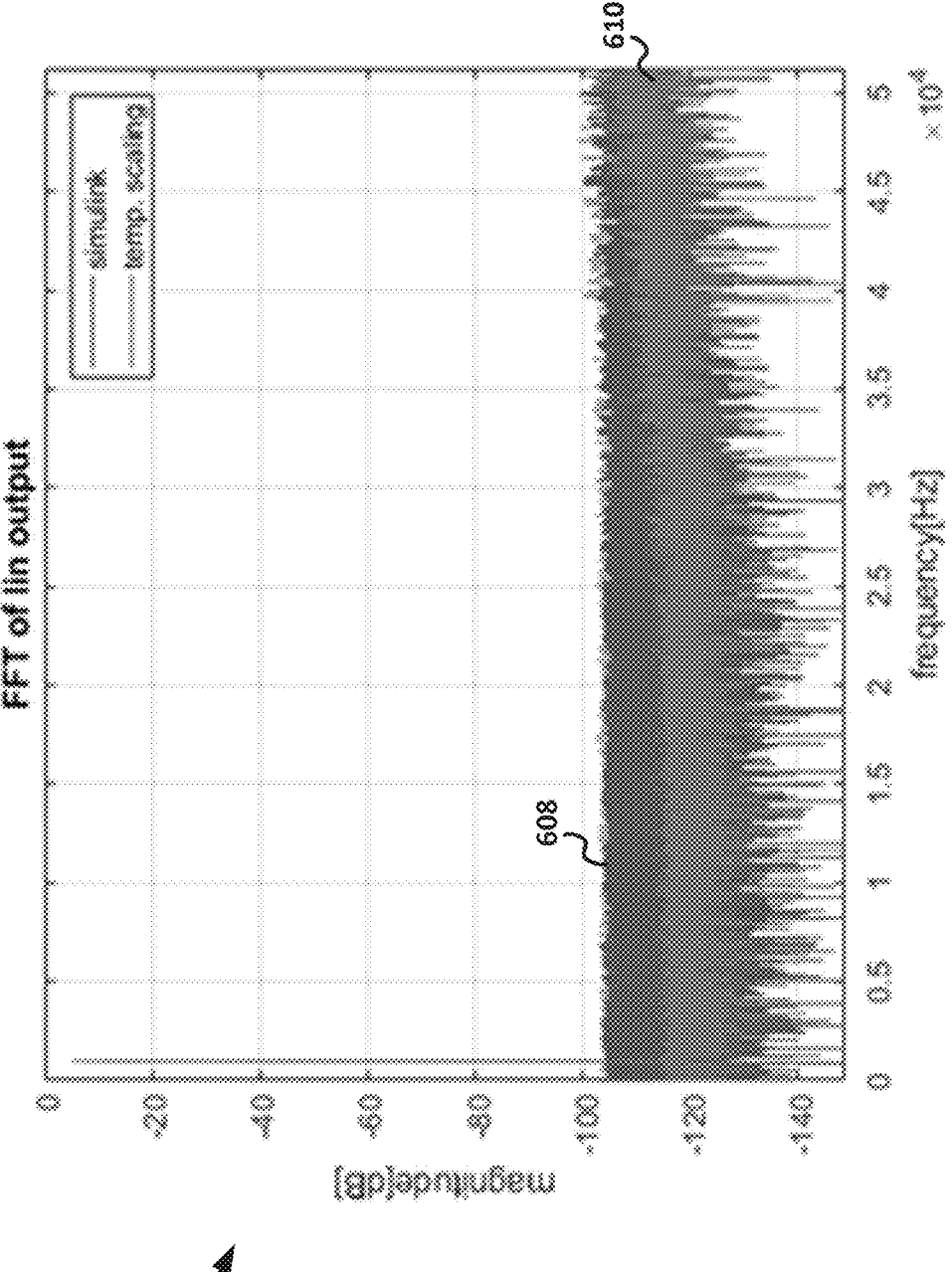
FIG. 6B is a graphical comparison of frequency domain signals for the digital IIR filter and ADC of FIG. 6A with and without transient reduction due to temporary scaling of filter coefficients, according to an embodiment.

FIG. 6B is a graphical comparison of frequency domain signals (amplitude versus frequency) for the digital IIR filter and ADC of FIG. 6A with and without transient reduction due to temporary scaling of filter coefficients, according to an embodiment. In FIG. 6B the noise level 608 of the digital microphone is shown at a first noise level without the transient reduction due to temporary scaling of filter coefficients, and the noise level 610 of the digital microphone is shown at a second noise level less than the first noise level with the transient reduction due to temporary scaling of filter coefficients, according to an embodiment.

In the simulation used to generate the signals shown in FIG. 6A and FIG. 6B, a third order digital IIR low-pass filter was chosen to show the reduction of the transients based on the method of temporary scaling of filter coefficients, according to an embodiment. Simulation parameters included: a gain switching of 3 dB; an input signal frequency of 1 kHz at −5 dBFS; and wherein an ADC was included. In conclusion, neither FIG. 6A (time domain) nor FIG. 6B (frequency domain) shows any evidence of audible transients when the temporary scaling of filter coefficients according to embodiments was used.

Figure 7:
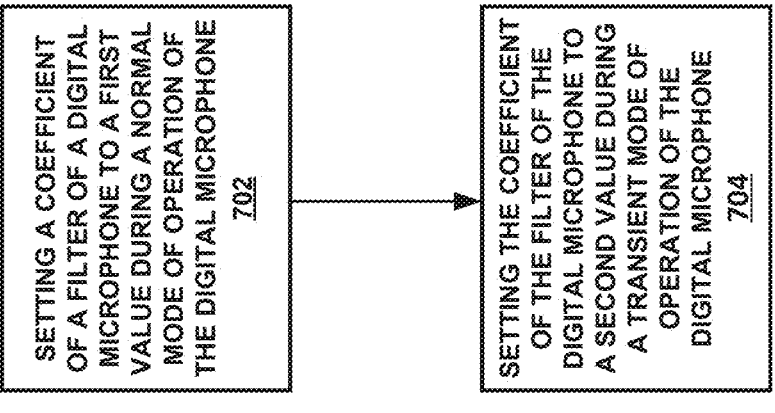
FIG. 7 is a block diagram of a digital microphone with transient reduction due temporary scaling of filter coefficients, according to an embodiment.

FIG. 7 is a block diagram 700 of a digital microphone with transient reduction due temporary scaling of filter coefficients, according to an embodiment. The method shown in block diagram 700 comprises setting a coefficient of a filter of the digital microphone to a first value during a normal mode of operation of the digital microphone at step 702; and setting the coefficient of the filter of the digital microphone to a second value during a transient mode of operation of the digital microphone at step 704.

While several types of digital filters have been shown and described herein, it will be appreciated by those skilled in the art that many other types of filters in the digital signal processing chain of a digital microphone could benefit from the temporary scaling of filter coefficients in order to minimize audible transients. It should also be noted that as used herein, the filter coefficient symbols are meant to convey not only a value or values for the filter coefficient, but also the nature of the filter coefficient as being embodied in a corresponding memory or lookup table (LUT).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A digital microphone comprising:
   a programmable gain amplifier (PGA);
   an analog-to-digital converter (ADC) coupled to the PGA;
   a digital filter coupled to the ADC, wherein the digital filter comprises a plurality of coefficients; and
   a digital gain compensation component coupled to the digital filter,
   wherein the plurality of coefficients each comprise a first value during a normal mode of operation of the digital microphone, wherein at least one of the plurality of coefficients comprises a second value during a first cycle of a transient mode of operation of the digital microphone, and wherein at least two of the plurality of coefficients comprise the second value during a second cycle of the transient mode of operation.

2. The digital microphone of claim 1, wherein the digital filter comprises:

a delay line including a plurality of serially coupled delay components;

a plurality of coefficients coupled to corresponding delay components of the delay line, wherein the plurality of coefficients comprise a volatile memory component, a non-volatile memory component, or a lookup table (LUT); and a summer coupled to at least one of the plurality of coefficients.

3. The digital microphone of claim 2, wherein a length of the transient mode of operation corresponds to an order of the digital filter.

4. The digital microphone of claim 2, wherein the digital filter comprises a digital finite impulse response (FIR) filter.

5. The digital microphone of claim 2, wherein the digital filter comprises a digital infinite impulse response (IIR) filter.

6. The digital microphone of claim 5, wherein the digital IIR filter comprises a second order direct form digital IIR filter.

7. The digital microphone of claim 5, wherein the digital IIR filter comprises a second order canonical form digital IIR filter.

8. The digital microphone of claim 1, wherein at least another of the plurality of coefficients comprises both the first value and the second value during the transient mode of operation.

9. The digital microphone of claim 1, wherein at least another of the plurality of coefficients comprises only the first value during the transient mode of operation.

10. The digital microphone of claim 1, wherein the normal mode of operation comprises a first portion corresponding to a first gain value of the digital microphone, and wherein the normal mode of operation comprises a second portion corresponding to a second gain value of the digital microphone.

11. The digital microphone of claim 10, wherein the transient mode of operation is interposed between the first portion of the normal mode of operation and the second portion of the normal mode of operation.

12. A method of operating a digital microphone, the method comprising:

adjusting a gain of a signal path of the digital microphone, wherein the signal path comprises a programmable gain amplifier (PGA), an analog-to-digital converter (ADC) coupled to the PGA, a filter coupled to the ADC, wherein the filter comprises a plurality of coefficients, and a digital gain compensation component coupled to the filter, wherein adjusting the gain of the signal path of the digital microphone further comprises:

setting a coefficient of the filter of the digital microphone to a first value during a normal mode of operation of the digital microphone;

setting the coefficient of the filter of the digital microphone to a second value during a first cycle of a transient mode of operation of the digital microphone; and setting at least two coefficients of the filter of the digital microphone to the second value during a second cycle of the transient mode of operation of the digital microphone.

13. The method of claim 12, further comprising setting at least another coefficient of the filter to both the first value and to the second value during the transient mode of operation.

14. The method of claim 12, further comprising setting at least another coefficient of the filter to only the first value during the transient mode of operation.

15. The method of claim 12, wherein the normal mode of operation comprises a first portion corresponding to a first gain value of the digital microphone, and wherein the normal mode of operation comprises a second portion corresponding to a second gain value of the digital microphone.

16. The method of claim 15, wherein the transient mode of operation is interposed between the first portion of the normal mode of operation and the second portion of the normal mode of operation.

17. A digital microphone comprising:

a programmable gain amplifier (PGA);

an analog-to-digital converter (ADC) coupled to the PGA;

a digital filter coupled to the ADC, wherein the digital filter comprises a plurality of coefficients; and a digital modulator coupled to the digital filter, wherein the plurality of coefficients each comprise a first value during a normal mode of operation of the digital microphone, wherein at least one of the plurality of coefficients comprises a second value during a first cycle of a transient mode of operation of the digital microphone, and wherein at least two of the plurality of coefficients comprise the second value during a second cycle of the transient mode of operation.

18. The digital microphone of claim 17, wherein at least another of the plurality of coefficients comprises both the first value and the second value during the transient mode of operation.

19. The digital microphone of claim 17, wherein at least another of the plurality of coefficients comprises only the first value during the transient mode of operation.

20. The digital microphone of claim 17, wherein the normal mode of operation comprises a first portion corresponding to a first gain value of the digital microphone, and wherein the normal mode of operation comprises a second portion corresponding to a second gain value of the digital microphone.

21. The digital microphone of claim 20, wherein the transient mode of operation is interposed between the first portion of the normal mode of operation and the second portion of the normal mode of operation.

\* \* \* \* \*